United States Patent
Wen et al.

(10) Patent No.: US 10,897,810 B2
(45) Date of Patent: Jan. 19, 2021

(54) HIGH SPEED SIGNAL FAN-OUT METHOD FOR BGA AND PRINTED CIRCUIT BOARD USING THE SAME

(71) Applicant: CELESTICA TECHNOLOGY CONSULTANCY (SHANGHAI) CO. LTD, Shanghai (CN)

(72) Inventors: Jiwei Wen, Shanghai (CN); Chenxia Feng, Shanghai (CN); Liang Chen, Shanghai (CN); Lijuan Qu, Shanghai (CN)

(73) Assignee: CELESTICA TECHNOLOGY CONSULTANCY (SHANGHAI) CO. LTD, Shanghai (CN)

( * ) Notice: Subject to any disclaimer, the term of this patent is extended or adjusted under 35 U.S.C. 154(b) by 0 days.

(21) Appl. No.: 16/234,829

(22) Filed: Dec. 28, 2018

(65) Prior Publication Data
US 2019/0208618 A1  Jul. 4, 2019

(30) Foreign Application Priority Data

Dec. 29, 2017 (CN) .......................... 2017 1 14741826

(51) Int. Cl.
*H05K 1/11* (2006.01)
*H05K 1/02* (2006.01)
(Continued)

(52) U.S. Cl.
CPC .......... *H05K 1/0216* (2013.01); *H05K 1/115* (2013.01); *H05K 3/0047* (2013.01); *H05K 3/043* (2013.01);
(Continued)

(58) Field of Classification Search
CPC .......... H05K 2201/09418; H05K 2201/09636; H05K 2203/0207; H05K 1/0251;
(Continued)

(56) References Cited

U.S. PATENT DOCUMENTS 4,764,644 A * 8/1988 Reisman ............... H01L 21/485
174/253
7,385,470 B2 * 6/2008 Kwong .................. H05K 1/115
174/250

(Continued)

OTHER PUBLICATIONS

Definition of "through" from www.thefreedictionary.com (Year: 2019).*

*Primary Examiner* — Roshn K Varghese
(74) *Attorney, Agent, or Firm* — Global IP Services; Tianhua Gu

(57) ABSTRACT

The present invention provides a high speed signal fan-out method for BGA and a PCB using the same. The method comprises: providing a printed circuit board (PCB), providing a plurality of vias and signal traces of the vias on the PCB; and providing back-drilled holes for routing of other signal traces at positions corresponding to the vias. The vias are arranged into a plurality of straight lines from an edge to the center of the PCB. The plurality of straight lines each is horizontal or vertical. The signal traces of the vias in a straight line are arranged from high to low or from low to high with respect to routing positions of the vias, and the back-drilled holes of the plurality of vias are arranged in descending or ascending order corresponding to the depths of the back-drilled holes.

14 Claims, 3 Drawing Sheets

(51) Int. Cl.
*H05K 3/00* (2006.01)
*H05K 3/04* (2006.01)

(52) U.S. Cl.
CPC ............ *H05K 2201/09227* (2013.01); *H05K 2201/09609* (2013.01); *H05K 2201/09636* (2013.01); *H05K 2201/09672* (2013.01); *H05K 2203/0207* (2013.01)

(58) Field of Classification Search
CPC .......... H05K 1/0298; H05K 1/11–116; H05K 2201/09072; H05K 2201/09281; H05K 2201/09227; H05K 1/0216; H05K 3/043; H05K 3/0047; H05K 2201/09609; H05K 2201/09672; H01L 23/5226; H01P 3/084
See application file for complete search history.

(56) References Cited

U.S. PATENT DOCUMENTS

| | | | |
|---|---|---|---|
| 7,402,757 B1* | 7/2008 | Noujeim | H05K 1/0216 174/255 |
| 8,667,675 B2* | 3/2014 | Dudnikov, Jr. | H05K 1/0257 174/259 |
| 9,202,783 B1* | 12/2015 | Simpson | H01L 23/49838 |
| 10,201,085 B2* | 2/2019 | Iketani | H05K 3/4623 |
| 2011/0132648 A1* | 6/2011 | Mutnury | H05K 1/0245 174/260 |
| 2013/0009322 A1* | 1/2013 | Conn | H01L 21/76898 257/774 |
| 2013/0330941 A1* | 12/2013 | Jeon | H01R 12/585 439/65 |
| 2015/0092374 A1* | 4/2015 | Isaacs | H05K 1/0206 361/767 |
| 2015/0189754 A1* | 7/2015 | Bohra | H05K 1/115 174/262 |
| 2015/0264804 A1* | 9/2015 | Huang | H05K 3/0047 174/262 |
| 2015/0348901 A1* | 12/2015 | Warwick | H01L 21/76843 257/774 |
| 2015/0351240 A1* | 12/2015 | Nabeyama | H05K 1/115 361/760 |
| 2018/0184515 A1* | 6/2018 | Anand | H05K 1/0216 |

\* cited by examiner

HIGH SPEED SIGNAL FAN-OUT METHOD FOR BGA AND PRINTED CIRCUIT BOARD USING THE SAME

BACKGROUND OF THE PRESENT INVENTION

Field of Invention

The present invention relates to the field of electronic circuits, in particular, to the field of packaging technologies, and specifically to a high speed signalfan-out method for BGA.

Description of Related Arts

The full name of BGA is Ball Grid Array (BGA), which means preparing array balls at the bottom portion of a package substrate and using the array balls as an I/O terminal of a circuit to interconnect to a printed circuit board (PCB). A component packaged by using this technology is a PCB.

The BGA packaging emerged in early 1990s, and now has been developed to a mature high-density packaging technology. Among all packaging types of semiconductor ICs, the BGA packaging obtained the fastest growing speed during five years from 1996 to 2001. In 1999, the output of BGA was about 1 billion. However, up to now, the technology has been limited to packaging of high-density and high-performance components. In addition, the technology is still developing toward a fine pitch and a large I/O terminal number. The BGA packaging technology is mainly applicable to packaging of components such as a PC chip set, a microprocessor/controller, an ASIC, a gate array, a memory, a DSP, a PDA, and a PLD.

However, compared with the previous signals, for current 25-Gbps and 56-Gbps signals through high speed traces of BGA, total voltage swings remain the same, Baud rates and bit rates of the signals are increased, and the noise tolerance is reduced. In addition, as the size of BGA chips further increases, the total quantity of signals increases, which increases the crosstalk, thereby increasing the signal noise.

SUMMARY OF THE PRESENT INVENTION

To resolve the foregoing and other potential technical problems, embodiments of the present invention provide a high speed signalfan-out method for BGA. The high speed signalfan-out method for BGA comprises: providing a printed circuit board (PCB), providing a plurality of vias and signal traces of the vias on the PCB; and providing back-drilled holes for routing of other signal traces at positions corresponding to the vias.

In an embodiment of the present invention, the vias are arranged into a plurality of straight lines from an edge to the center of the PCB.

In an embodiment of the present invention, the plurality of straight lines each is horizontal or vertical.

In an embodiment of the present invention, the signal traces of the vias in a straight line are arranged from high to low with respect to routing positions of the vias, and the back-drilled holes of the plurality of vias are arranged in descending order corresponding to the depths of the back-drilled holes.

In an embodiment of the present invention, the signal traces of the vias in a straight line are arranged from low to high with respect to routing positions of the vias, and the back-drilled holes of the plurality of vias are arranged in ascending order corresponding to the depths of the back-drilled holes.

An embodiment of the present invention further provides a printed circuit board (PCB), the PCB is provided with ball grid array (BGA), wherein a plurality of vias and signal traces of the vias are provided on the PCB, and back-drilled holes for routing of other signal traces are provided at positions corresponding to the vias on the PCB.

In an embodiment of the present invention, the vias are arranged into a plurality of straight lines from an edge to the center of the PCB.

In an embodiment of the present invention, the plurality of straight lines each is horizontal or vertical.

In an embodiment of the present invention, the signal traces of the vias in a straight line are arranged from high to low with respect to routing positions of the vias, and the back-drilled holes of the plurality of vias are arranged in descending order corresponding to the depths of the back-drilled holes.

In an embodiment of the present invention, the signal traces of the vias in a straight line are arranged from low to high with respect to routing positions of the vias, and the back-drilled holes of the plurality of vias are arranged in ascending order corresponding to the depths of the back-drilled holes.

As described above, the high speed signal fan-out method for BGA and the PCB using the method have the following beneficial effects:

In the present invention, the signal traces route through the back-drilled holes, which have no signal, and no signal traces route through signal current vias. The number of vias through which the signal traces route is reduced, the cross-talk is reduced. The signal quality is effectively improved.

BRIEF DESCRIPTION OF THE DRAWINGS

To describe the technical solutions of embodiments of the present invention more clearly, the following introduces the accompanying drawings required for briefly describing the embodiments. Apparently, the accompanying drawings in the following description show merely some embodiments of the present invention, and a person of ordinary skill in the art could derive other drawings from these accompanying drawings without creative efforts.

Component Label Description

101: Vias
102: Back-drilled hole
S110 to S120: Steps

DETAILED DESCRIPTION OF THE PREFERRED EMBODIMENTS

The embodiments of the present invention will be described through specific embodiments in the following. One skilled in the art can easily understand other advantages and effects of the present invention according to contents disclosed by the description. The present invention can also be implemented or applied through other different specific embodiments. Various modifications or changes can also be made to all details in the description based on different points of view and applications without departing from the spirit of the present invention. It needs to be stated that the following embodiments and the features in the embodiments can be combined with one another under the situation of no conflict.

Referring to FIG. 1 to FIG. 4, it should be noted that structures, scales, and sizes illustrated in the accompanying drawings of this specification in cooperation with the contents disclosed in this specification are all used for those skilled in the art understanding and reading, and not intended to limit conditions for implementing the present invention, and therefore do not have essential technical meanings. Any modification of the structures, changes in the scale relationship, or adjustment of the sizes shall fall within the scope that can be covered by the technical contents disclosed in the present invention without affecting the efficacy and the purpose that can be achieved by the present invention. Meanwhile, terms such as "up", "down", "left", "right", "middle" and "one" quoted in this specification are also used for brief description, and are not intended to limit the scope that can be implemented by the present invention. Changes or adjustments of relative relationships of the terms should be considered within the scope that can be implemented by the present invention if no essential technical content is changed.

An objective of the embodiments is to provide a high speed signal fan-out method for BGA and a PCB, to resolve crosstalk problems and improve the signal quality when signal traces route through vias.

The principle and embodiments of the high speed signal fan-out method for BGA and the PCB using the same of the present invention are described in detail below, so that those skilled in the art can understand the high speed signal fan-out method for BGA and the PCB of the present invention without creative efforts.

Figure 1:
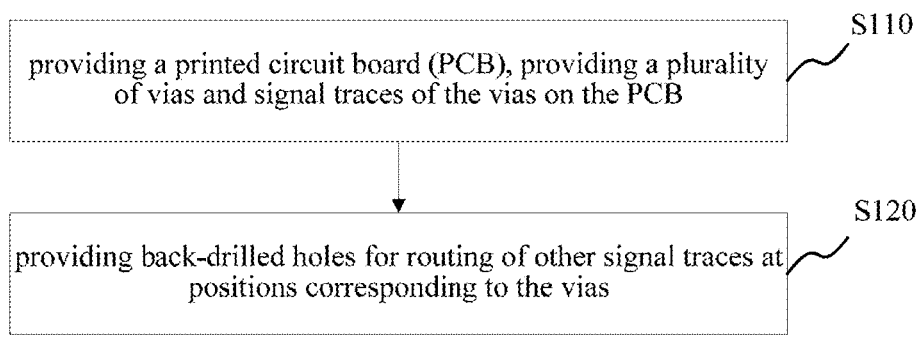
FIG. 1 is a schematic flowchart of a high speed signal fan-out method for BGA of the present invention.

As shown in FIG. 1, the present embodiment provides a high speed signal fan-out method for BGA. The high speed signal fan-out method for BGA comprises:

Step S110: providing a printed circuit board (PCB), providing a plurality of vias and signal traces of the vias on the PCB.

Step S120: providing back-drilled holes for routing of other signal traces at positions corresponding to the vias.

Figure 2:
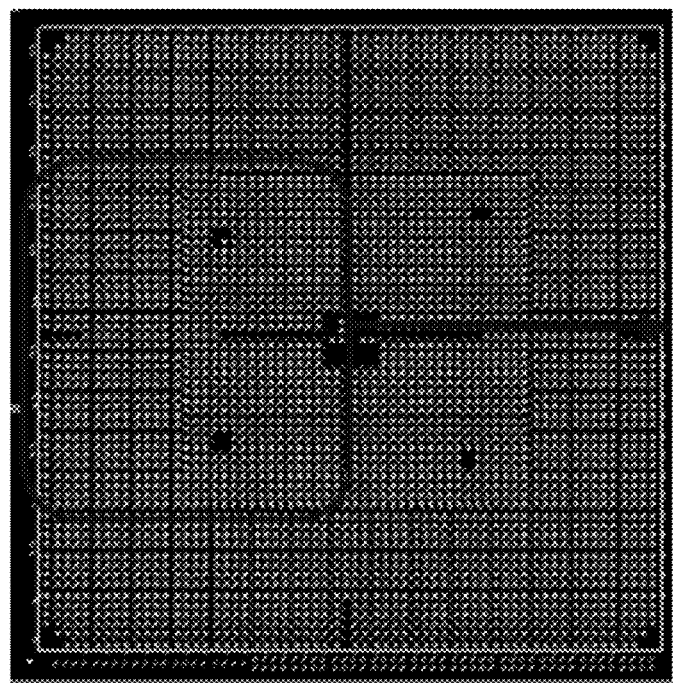
FIG. 2 is a surface schematic diagram of a PCB provided with BGA of the present invention.
Figure 3:
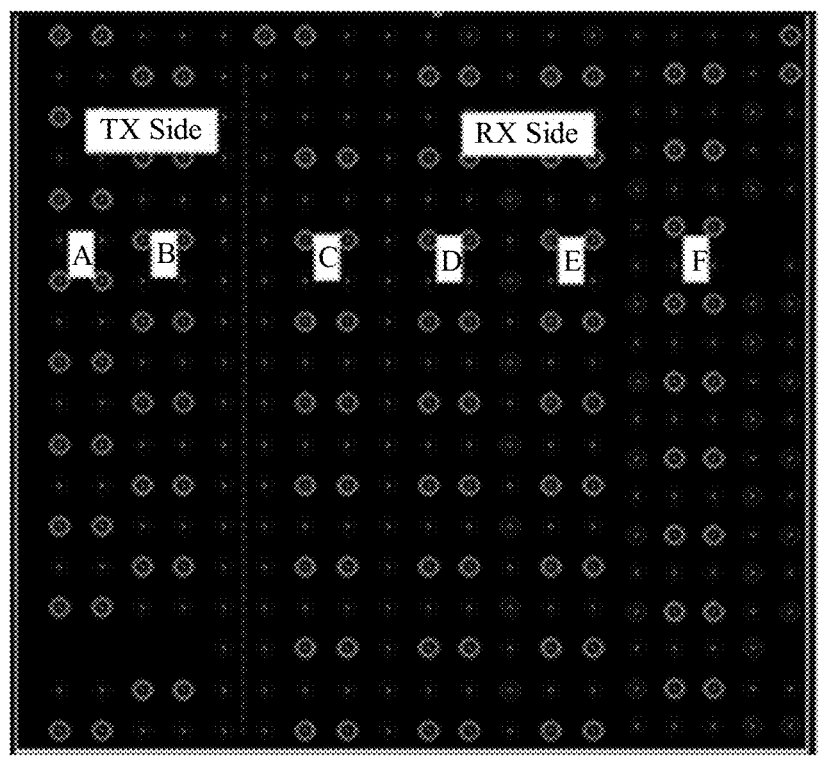
FIG. 3 is a schematic diagram of via positions on a PCB of the present invention.
Figure 4:
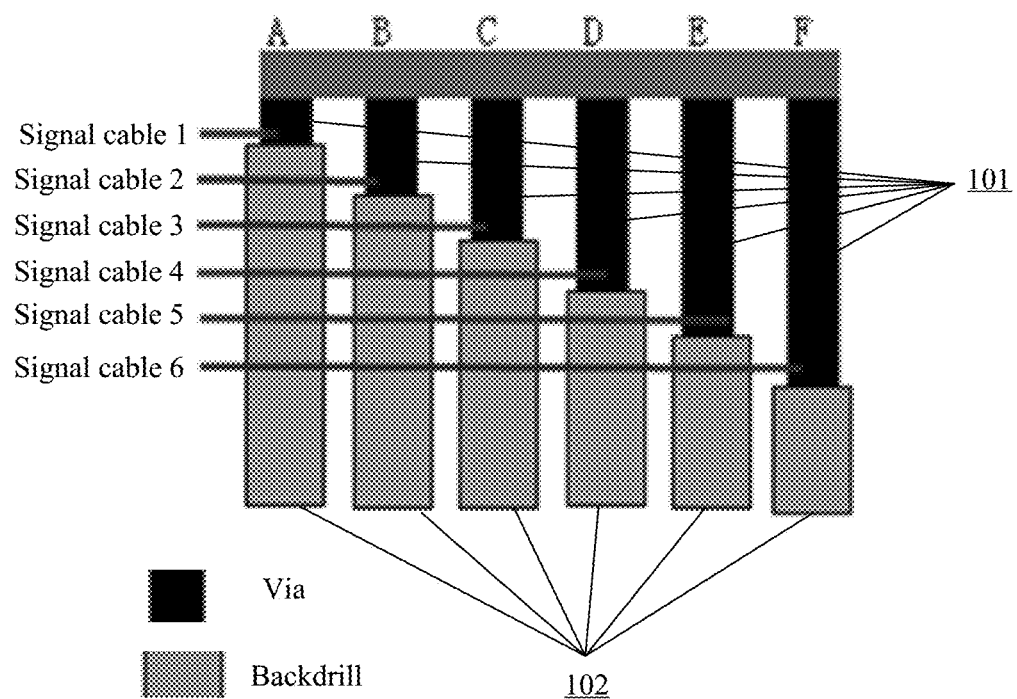
FIG. 4 is a schematic diagram of a positional arrangement relationship between vias, signal traces and back-drilled holes provided on a PCB in the present invention.

As shown in FIG. 2 to FIG. 4, step S110 and step S120 of the high speed signal fan-out method for BGA are described in detail below according to the present embodiment.

Step S110: providing a printed circuit board (PCB), providing a plurality of vias and signal traces of the vias on the PCB.

In the present embodiment, as shown in FIG. 1, the PCB is provided with BGA.

As shown in FIG. 4, the vias 101 are also referred to as through holes, are formed by drilling the entire PCB from the top layer to the bottom layer. For example, in a four-layer PCB, the vias 101 run through layer 1, layer 2, layer 3, and layer 4. This hinders routing in irrelevant layers.

The vias 101 are mainly classified into two types: One type is Plating Through Hole (PTH), where copper is provided on the hole wall, and the PTH is generally a conductive hole (VIA PAD) or a component hole (DIP PAD); the other type is Non Plating Through Hole (NPTH), where no copper is provided on the hole wall, and the NPTH is generally a positioning hole or a screw hole.

Wherein, the hole wall of the vias 101 is generally plated with copper. When a signal trace routes through other vias 101, signal crosstalk and signal noise is increased due to the plated copper, which affects the signal quality.

Step S120: providing back-drilled holes 102 for routing of other signal traces at positions corresponding to the vias 101.

The back-drilled hole 102 is a hole which is formed by removing excess plated copper of the vias 101 and has no plated copper on its inner wall. Because the vias 101 always generate an excess copper-plated part, when the frequency of a circuit signal is increased to a particular extent, the excess copper will equal to an antenna, signal radiation is generated, which causes interference to other surrounding signals and affects normal working of a circuit system when the interference is severe. In the present invention, the signal traces are routing through back-drilled holes, and not routing in areas of the vias 101, so that the problem of signal crosstalk is eliminated.

In the present embodiment, as shown in FIG. 1, the plurality of vias 101 are arranged in a plurality of straight lines from an edge to the center of the PCB.

Preferably, the plurality of straight lines each is horizontal or vertical.

In the present embodiment, FIG. 3 is a part circled in FIG. 2. The part is on the left part of the PCB, and it is a square circled from an edge to the center of the PCB. As shown in FIG. 2, the plurality of vias 101 are provided along the horizontal direction from an edge to the center of the PCB. For example, as shown in FIG. 3, A, B, C, D, E and F are positions selected for the vias 101.

As shown in FIG. 4, the signal traces of the vias 101 in a straight line are arranged from high to low with respect to routing positions of the vias 101 (from the top layer to the bottom layer of the PCB), and the back-drilled holes 102 of the vias 101 are arranged in descending order corresponding to the depths of the back-drilled holes.

In other words, as shown in FIG. 4, below the routing positions of the signal traces corresponding to the vias 101, all of the copper plating of the vias 101 is drilled to form a back-drilled hole 102 having no copper plating on the inner wall.

As shown in FIG. 4, below routing positions of the vias 101 (A) corresponding to the signal traces 1, it is a back-drilled hole 102 having no copper plating on the inner wall. Below routing positions of the vias 101 (B) corresponding to the signal traces 2, it is a back-drilled hole 102 having no copper plating on the inner wall. Below routing positions of the vias 101 (C) corresponding to the signal traces 3, it is a back-drilled hole 102 having no copper plating on the inner wall. Below routing positions of the vias 101 (D) corresponding to the signal traces 4, it is a back-drilled hole 102 having no copper plating on the inner wall. Below routing positions of the vias 101 (E) corresponding to the signal traces 5, it is a back-drilled hole 102 having no copper plating on the inner wall. Below routing positions of the vias 101 (F) corresponding to the signal traces 6, it is a back-drilled hole 102 having no copper plating on the inner wall.

In this way, the signal trace 6 is traced through the back-drilled holes 102 of the via 101 (A), the via 101 (B), the via 101 (C), the via 101 (D), and the via 101 (E) respectively. There is no signal in the back-drilled holes 102. In addition, the signal trace 6 does not route through signal current vias. The signal trace 5 is traced through the back-drilled holes 102 of the vias 101 (A), the vias 101 (B), the vias 101 (C), and the via 101 (D) respectively. There is no signal in the back-drilled holes 102. In addition, the signal trace 5 does not route through signal current vias. The signal trace 4 is traced through the back-drilled holes 102 of the vias 101 (A), the vias 101 (B), and the via 101 (C) respectively. There is no signal in the back-drilled holes 102. In addition, the signal trace 4 does not route through signal current vias. The signal trace 3 is traced through back-drilled holes 102 of the vias 101 (A) and the vias 101 (B) respectively. There is no signal in the back-drilled holes 102. In addition, the signal trace 3 does not route through signal current vias. The signal trace 2 is traced through the back-drilled hole 102 of the vias 101 (A). There is no signal in the back-drilled hole 102. In addition, the signal trace 1 does not route through signal current vias.

In the present embodiment, the signal traces of the vias 101 in a straight line are arranged from low to high with respect to routing positions of the vias 101, and the back-drilled holes 102 of the vias 101 are arranged in ascending order corresponding to the depths of the back-drilled holes 102. A routing arrangement of the signal traces and an arrangement of length setting of the back-drilled holes 102 are contrary to the above, and the principle is the same as that of the foregoing description, details are not described again herein.

An embodiment of the present invention further provides a PCB. The PCB is provided with BGA, a plurality of vias 101 and signal traces of the vias 101 are provided on the PCB, and back-drilled holes 102 for routing of other signal traces are provided at positions corresponding to the vias 101 on the PCB.

The vias 101 are also referred to as through holes, and are formed by drilling the entire PCB from the top layer to the bottom layer. For example, in a four-layer PCB, the vias 101 run through layer 1, layer 2, layer 3, and layer 4. This hinders routing in irrelevant layers.

The vias 101 are mainly classified into two types: One type is Plating Through Hole (PTH), where copper is provided on the hole wall, and generally it is a conductive hole (VIA PAD) or a component hole (DIP PAD); the other type is Non Plating Through Hole (NPTH), where no copper is provided on the hole wall, and generally it is a positioning hole or a screw hole.

Wherein, the hole wall of the vias 101 is generally plated with copper. When a signal trace passes through other vias 101, signal crosstalk and signal noise is increased due to the plated copper, which affects the signal quality.

The back-drilled hole 102 is a hole which is formed by removing excess plated copper of the vias 101 and has no plated copper on its inner wall. Because the vias 101 always generate an excess copper-plated part, when the frequency of a circuit signal is increased to a particular extent, the excess copper will equal to an antenna, signal radiation is generated, which causes interference to other surrounding signals and affects normal working of a circuit system when the interference is severe. In the present invention, the signal traces are routing through back-drilled holes, and not routing in areas of the vias 101, so that the problem of signal crosstalk is eliminated.

In the present embodiment, the plurality of vias 101 are arranged in a plurality of straight lines from an edge to the center of the PCB.

Preferably, the plurality of straight lines each is horizontal or vertical.

In the present embodiment, FIG. 3 is a part circled in FIG. 2. The part is on the left part of the PCB, and it is a square circled from an edge to the center of the PCB. As shown in FIG. 2, a plurality of vias 101 are provided along the horizontal direction from an edge to the center of the PCB. For example, as shown in FIG. 3, A, B, C, D, E and F are positions selected for the vias 101.

As shown in FIG. 4, the signal traces of the vias 101 in a straight line are arranged from high to low with respect to routing positions of the vias 101 (from the top layer to the bottom layer of the PCB), and the back-drilled holes 102 of the vias 101 are arranged in descending order corresponding to the depths of the back-drilled holes 102.

In other words, as shown in FIG. 4, below the routing positions of the signal traces corresponding to the vias 101, all of the copper plating of the vias 101 is drilled to form a back-drilled hole 102 having no copper plating on the inner wall.

As shown in FIG. 4, below routing positions of the vias 101 (A) corresponding to the signal traces 1, it is a back-drilled hole 102 having no copper plating on the inner wall. Below routing positions of the vias 101 (B) corresponding to the signal traces 2, it is a back-drilled hole 102 having no copper plating on the inner wall. Below routing positions of the vias 101 (C) corresponding to the signal traces 3, it is a back-drilled hole 102 having no copper plating on the inner wall. Below routing positions of the vias 101 (D) corresponding to the signal traces 4, it is a back-drilled hole 102 having no copper plating on the inner wall. Below routing positions of the vias 101 (E) corresponding to the signal traces 5, it is a back-drilled hole 102 having no copper plating on the inner wall. Below routing positions of the vias 101 (F) corresponding to the signal traces 6, it is a back-drilled hole 102 having no copper plating on the inner wall.

In this way, the signal trace 6 is traced through the back-drilled holes 102 of the vias 101 (A), the via 101 (B), the via 101 (C), the via 101 (D), and the vias 101 (E) respectively. There is no signal in the back-drilled holes 102. In addition, the signal trace 6 does not route through signal current vias. The signal trace 5 is traced through the back-drilled holes 102 of the via 101 (A), the via 101 (B), the via 101 (C), and the via 101 (D) respectively. There is no signal in the back-drilled holes 102. In addition, the signal trace 5 does not route through signal current vias. The signal trace 4 is traced through the back-drilled holes 102 of the vias 101 (A), the via 101 (B), and the via 101 (C) respectively. There is no signal in the back-drilled holes 102. In addition, the signal trace 4 does not route through signal current vias. The signal trace 3 is traced through back-drilled holes 102 of the vias 101 (A) and the vias 101 (B) respectively. There is no signal in the back-drilled holes 102. In addition, the signal trace 3 does not route through signal current vias. The signal trace 2 is traced through the back-drilled hole 102 of the vias 101 (A). There is no signal in the back-drilled hole 102. In addition, the signal trace 1 does not route through signal current vias.

In the present embodiment, the signal traces of the vias 101 in a straight line are arranged from low to high with respect to routing positions of the vias 101, and the back-drilled holes 102 of the vias 101 are arranged in ascending order corresponding to the depths of the back-drilled holes 102. A routing arrangement of the signal traces and an arrangement of length setting of the back-drilled holes 102 are contrary to the above, and the principle is the same as that of the foregoing description, details are not described again herein.

In conclusion, in the present invention, the signal traces route through the back-drilled holes, which have no signal. And no signal traces route through signal current vias. The number of vias through which the signal traces route is reduced, the crosstalk is reduced. The signal quality is effectively improved. Therefore, the present invention effectively overcomes various disadvantages in the prior art and has a high industrial utilization value.

The foregoing embodiments are merely intended to exemplarily describe the principle and effects of the present invention, rather than limiting the present invention. Any person skilled in the art can make modifications or variations on the foregoing embodiments without departing from the spirit and scope of the present invention. Accordingly, all equivalent modifications or changes made by those skilled in the art without departing from the spirit and technical scope of the invention are intended to be covered by the claims of the present invention.

What is claimed is:

1. A high speed signal fan-out method for ball grid array (BGA), comprising: providing a printed circuit board (PCB), providing a plurality of vias and a plurality of signal traces on the PCB; the plurality of vias include a first via electrically connected to a first signal trace, a second via adjacent to the first via electrically connected to a second signal trace and a third via adjacent to the second via, wherein the first via comprises a first back-drilled hole directly below the first via and the first signal trace, wherein the second signal trace passes through the first back-drilled hole to directly cross over the first back-drilled hole, in a direction away from the third via.

2. The high speed signal fan-out method for BGA as in claim 1, wherein the vias are arranged into a plurality of straight lines from an edge to a center of the PCB.

3. The high speed signal fan-out method for BGA as in claim 2, wherein the plurality of straight lines each is horizontal or vertical.

4. The high speed signal fan-out method for BGA as in claim 3, wherein the signal traces of the vias in a straight line are arranged from high to low with respect to routing positions of the vias, and the back-drilled holes of the plurality of vias are arranged in descending order corresponding to the depths of the back-drilled holes.

5. The high speed signal fan-out method for BGA as in claim 3, wherein the signal traces of the vias in a straight line are arranged from low to high with respect to routing positions of the vias, and the back-drilled holes of the plurality of vias are arranged in ascending order corresponding to the depths of the back-drilled holes.

6. The high speed signal fan-out method for BGA as in claim 2, wherein the signal traces of the vias in a straight line are arranged from high to low with respect to routing positions of the vias, and the back-drilled holes of the plurality of vias are arranged in descending order corresponding to the depths of the back-drilled holes.

7. The high speed signal fan-out method for BGA as in claim 2, wherein the signal traces of the vias in a straight line are arranged from low to high with respect to routing positions of the vias, and the back-drilled holes of the plurality of vias are arranged in ascending order corresponding to the depths of the back-drilled holes.

8. A printed circuit board (PCB), the PCB is provided with ball grid array (BGA), wherein the PCB comprises a plurality of vias and a plurality of signal traces on the PCB; the plurality of vias include a first via electrically connected to a first signal trace, a second via adjacent to the first via electrically connected to a second signal trace and a third via adjacent to the second via, wherein the first via comprises a first back-drilled hole directly below the first via and the first signal trace, wherein the second signal trace passes through the first back-drilled hole to directly cross over the first back-drilled hole, in a direction away from the third via.

9. The PCB as in claim 8, wherein the vias are arranged into a plurality of straight lines from an edge to a center of the PCB.

10. The PCB as in claim 9, wherein the plurality of straight lines each is horizontal or vertical.

11. The PCB as in claim 10, wherein the signal traces of the vias in a straight line are arranged from high to low with respect to routing positions of the vias, and the back-drilled holes of the plurality of vias are arranged in descending order corresponding to the depths of the back-drilled holes.

12. The PCB as in claim 10, wherein the signal traces of the vias in a straight line are arranged from low to high with respect to routing positions of the vias, and the back-drilled holes of the plurality of vias are arranged in ascending order corresponding to the depths of the back-drilled holes.

13. The PCB as in claim 9, wherein the signal traces of the vias in a straight line are arranged from high to low with respect to routing positions of the vias, and the back-drilled holes of the plurality of vias are arranged in descending order corresponding to the depths of the back-drilled holes.

14. The PCB as in claim 9, wherein the signal traces of the vias in a straight line are arranged from low to high with respect to routing positions of the vias, and the back-drilled holes of the plurality of vias are arranged in ascending order corresponding to the depths of the back-drilled holes.

* * * * *